United States Patent
Welty

(10) Patent No.: US 7,667,519 B2
(45) Date of Patent: Feb. 23, 2010

(54) BIASING CIRCUIT FOR PASS TRANSISTOR FOR VOLTAGE LEVEL TRANSLATOR CIRCUIT

(75) Inventor: Mark Welty, Sherman, TX (US)

(73) Assignee: Texas Instruments Incorporated, Dallas, TX (US)

(*) Notice: Subject to any disclaimer, the term of this patent is extended or adjusted under 35 U.S.C. 154(b) by 163 days.

(21) Appl. No.: 11/419,831

(22) Filed: May 23, 2006

(65) Prior Publication Data

US 2006/0261877 A1 Nov. 23, 2006

Related U.S. Application Data

(60) Provisional application No. 60/683,884, filed on May 23, 2005.

(51) Int. Cl.
*H03L 5/00* (2006.01)
(52) U.S. Cl. ...................................... 327/333; 327/326
(58) Field of Classification Search ................. 327/333, 327/326; 326/62, 68, 80, 81
See application file for complete search history.

(56) References Cited

U.S. PATENT DOCUMENTS

| | | | | |
|---|---|---|---|---|
| 4,916,330 A | * | 4/1990 | Hatakeyama et al. | ........ 327/333 |
| 5,909,139 A | * | 6/1999 | Williams | ..................... 327/434 |
| 6,265,896 B1 | * | 7/2001 | Podlesny et al. | .............. 326/80 |
| 6,320,446 B1 | * | 11/2001 | Podlesny et al. | ............ 327/333 |
| 6,528,980 B1 | * | 3/2003 | Smith | ......................... 323/315 |
| 6,717,456 B2 | * | 4/2004 | Watanabe | .................... 327/437 |

OTHER PUBLICATIONS

Sedra/Smith, Microelectronic Circuits, 2004, 5th Edition, p. 210.*
"Definition of bias." PCMAG.COM; The Independent Guide to Technology. PCMAG.com, 2006. Web. Sep. 16, 2009. <http://www.pcmag.com/encyclopedia_term/0,2542,t=bias&i=38587,00.asp>.
Dhond, Prasad. "Secrets of level-translation revealed." Linear Technology Industrial Precision Op Amps. Oct. 27, 2004. Web. Sep. 15, 2009. <http://www.planetanalog.com/features/signal/showArticle.jhtml?articleID=51201009>.
"Schottky diode." Wikipedia, Aug. 26, 2009. Web. Sep. 15, 2009. <wikipedia.org/wiki/Schottky_diode>.

* cited by examiner

*Primary Examiner*—Lincoln Donovan
*Assistant Examiner*—Daniel Rojas
(74) *Attorney, Agent, or Firm*—William B. Kempler; Wade J. Brady III; Frederick J. Telecky, Jr.

(57) ABSTRACT

A pass transistor signal level translator between a first voltage level and a higher second voltage level having a bias circuit for the pass transistor including a first switching circuit coupled to the first voltage level for providing a bias voltage that is less than the first voltage level. A second switching circuit is coupled to the second voltage level for providing a pulse at substantially the second voltage to the bias voltage. A voltage clamping circuit is coupled between the bias voltage and a reference voltage.

18 Claims, 5 Drawing Sheets

US 7,667,519 B2

BIASING CIRCUIT FOR PASS TRANSISTOR FOR VOLTAGE LEVEL TRANSLATOR CIRCUIT

CROSS REFERENCE TO RELATED APPLICATIONS

This application claims the benefit of application Ser. No. 60/683,884 filed on May 23, 2005 which is incorporated herein by reference in its entirety.

FIELD OF THE INVENTION

This application relates to a biasing circuit for a signal translator circuit and more specifically to a biasing circuit of a bidirectional voltage level translator circuit for open-drain applications.

BACKGROUND OF THE INVENTION

Electronic devices are being designed to use lower and lower power supply voltages in order to reduce the power drain for the devices and the heat generated therein. This is especially helpful in portable, battery operated devices such as cellular telephones, PDAs, MP3 Players, for example because they are both battery powered and highly compact, so that heat dissipation is a problem. In addition, the lower voltage supplies allow higher speed operation, because the voltage swing of the signal is smaller and will therefore take place in less time than when a higher supply voltage is used. Therefore, even circuits that are not intended for highly compact and battery powered mobile applications are using lower and lower voltage supplies in order to obtain the speed benefits as well as the reduced power supply requirements and lower heat dissipation, which allows for reduced ventilation requirements. In this continuum of redesigns at lower voltages, it is common to have some circuits for a particular system available at the lowest voltage whereas other components may not yet have been redesigned and require higher voltage supplies in order to operate. If these two devices are utilized in a common system, there needs to be a circuit interfacing the signal flow between them in order that the different power supply voltages, and therefore signal swings, can be accommodated. A signal level translator circuit meets this need. Typically, these circuits are bidirectional in nature so that the signal flow can occur from either device to the other device. Although devices having a pin for selection of the direction in which the signal flow is to occur are known, it is preferable to eliminate this pin, and therefore the cost associate therewith, and design the circuit to automatically detect the direction in which the signal flow will occur. Circuits that perform this function are known in the art.

A signal translation circuit for $I^2C$ logic, for example, which utilizes open drain circuits on either end of the signal translator generally use a directionless pass gate transistor signal translator. The principle for operation of this type of circuit is shown in FIG. 1 generally as 100. Terminal A is connected to a circuit operating at a first signal voltage and terminal B is connected to a circuit operating at a second, higher signal voltage. Each of the terminals is pulled up to its respective voltage VCCA or VCCB by a respective pull-up resistor 102, 114. The terminals are connected together via a pass transistor 110 which is a NMOS transistor having a gate bias 108. As will be seen in later described circuits, the gate bias voltage is commonly coupled to the chip enable signal. A one-shot circuit 106 has one input connected to the terminal A side of the pass transistor 110 and a second input connected to the B side of the pass transistor 110. If the signal on one terminal transitions from a high level to a low level, the other terminal is pulled down to that voltage via the pass transistor 110, which is biased in its ON state. However, due to the body effect, the pass transistor is not very effective in pulling up the other terminal to its respective voltage supply. The pull up resistors 102, 114 provides sufficient drive to maintain the voltage on terminal A or terminal B, respectively once the transition is made. The one-shot circuit detects the transition and operates one of the pull-up PMOS transistors 104, 112 in order to pull the respective terminal up to its respective voltage supply. In view of the fact that one of the terminals will already be at its respective voltage supply level, both transistors 104, 112 can be turned on at once, as it will have no effect on the terminal that is already at its respective voltage supply.

The gate of the pass transistor should be biased to a voltage which is approximately one volt above the lower of the two VCC supply voltages. If the bias voltage is too high, there will be undesirable feed-through current from the high voltage terminal to the low voltage terminal. If the voltage is too low, the ON resistance of the pass transistor will be too high. A known bias circuit is shown is FIG. 2 generally as 200. As discussed above, the bias supply is connected to the chip enable line and is active low. This chip enable signal is inverted through a pair of inverters INV1 and INV2 and applied to the gates of a PMOS transistor P1 and NMOS transistor N1 coupled between the voltage supply VCCB and ground. The drains of the two transistors are connected via resistor R1. Once PMOS P1 is turned on by way of ENABLE node being driven to a low state, it provides a pull-up current to the bias line BIAS for the pass transistor through resistor R1. The transition is also applied to PMOS transistor P8 and NMOS transistor N4 which have the gates coupled together and coupled to the enable input. The output on line s1 is coupled to the base of PNP transistor Q1 having its emitter coupled to the bias line and its collector coupled to ground. With enable low, the base of Q1 is biased to VCCA through P8 and Q1 clamps node BIAS to one VBE above VCCA. The inclusion of a bipolar transistor Q1 requires that this circuit be implemented in a BiCMOS process. In addition, power is dissipated through resistor R1 and the enable time is longer or else a higher current through resistor R1 is required.

A second known biasing circuit is shown in FIG. 3 generally as 300. In this circuit, a NMOS transistor N1 is coupled to the chip enabled signal via a pair of inverters INV1 and INV2. It switches a current source having a current I to the BIAS line. The transitions are provided by a PNP transistor having its emitter coupled to the BIAS line and collector coupled to ground and a base coupled to a reference voltage which is equal to the input voltage reference VCCA plus an offset voltage. In addition to requiring a BiCMOS process, it requires complex bias generators that have a long delay time or a higher current.

Previous implementation of the bias circuits such as the ones shown in FIGS. 2 and 3 have a high static current on the order of 200 uA and have relatively long enable times on the order of two microseconds for the pass gate to be biased on.

Accordingly, there is a need for a signal translator circuit that can be fabricated by an all CMOS process and which can have a faster enable time and a lower static current requirement.

SUMMARY OF THE INVENTION

This and other objects and features are provided in accordance with one aspect of the invention by a pass transistor signal level translator between a first voltage level and a higher second voltage level having a bias circuit for the pass transistor comprising a first switching circuit coupled to the first voltage level for providing a bias voltage that is less than the first voltage level. A second switching circuit is coupled to the second voltage level for providing a pulse at substantially the second voltage to the bias voltage. A voltage clamping circuit is coupled between the bias voltage and a reference voltage.

Another aspect of the invention includes a pass transistor signal level translator comprising a first terminal related to a first voltage level. A second terminal is related to a second voltage level, the second voltage level exceeding the first voltage level. A pass transistor is coupled between the first and second terminals. A bias circuit controls the pass transistor comprising a first circuit providing a voltage less than the first voltage level coupled to a gate of the pass transistor. A pulse generator generates a pulse at the second voltage level coupled to the gate of the pass transistor. A voltage clamping circuit is coupled between the gate of the pass transistor and a reference voltage.

A further aspect of the invention includes a method of biasing a pass transistor in a pass transistor signal level translator circuit coupled between a first terminal related to a first voltage and a second terminal related to a second voltage greater than the first voltage comprising providing a first switched voltage related to the first voltage. Providing a second switched voltage related to the second voltage. Providing a steady state voltage related to the second voltage; and clamping the bias voltage at one $V_T$ above the first voltage.

BREIF DESCPRITION OF THE DRAWINGS

DETAILED DESCRIPTION

Figure 1:
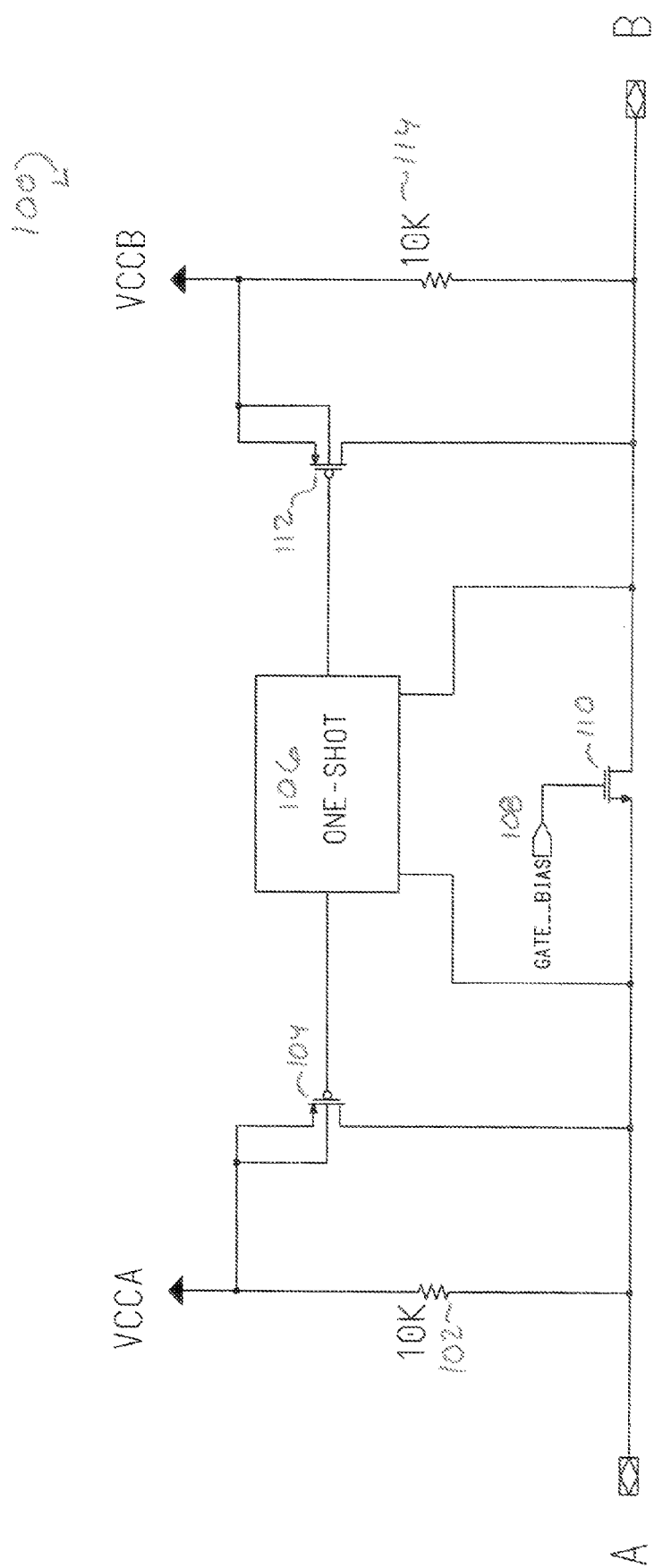
FIG. 1 is a schematic block diagram showing a basic design for a pass transistor signal translator circuit.
Figure 2:
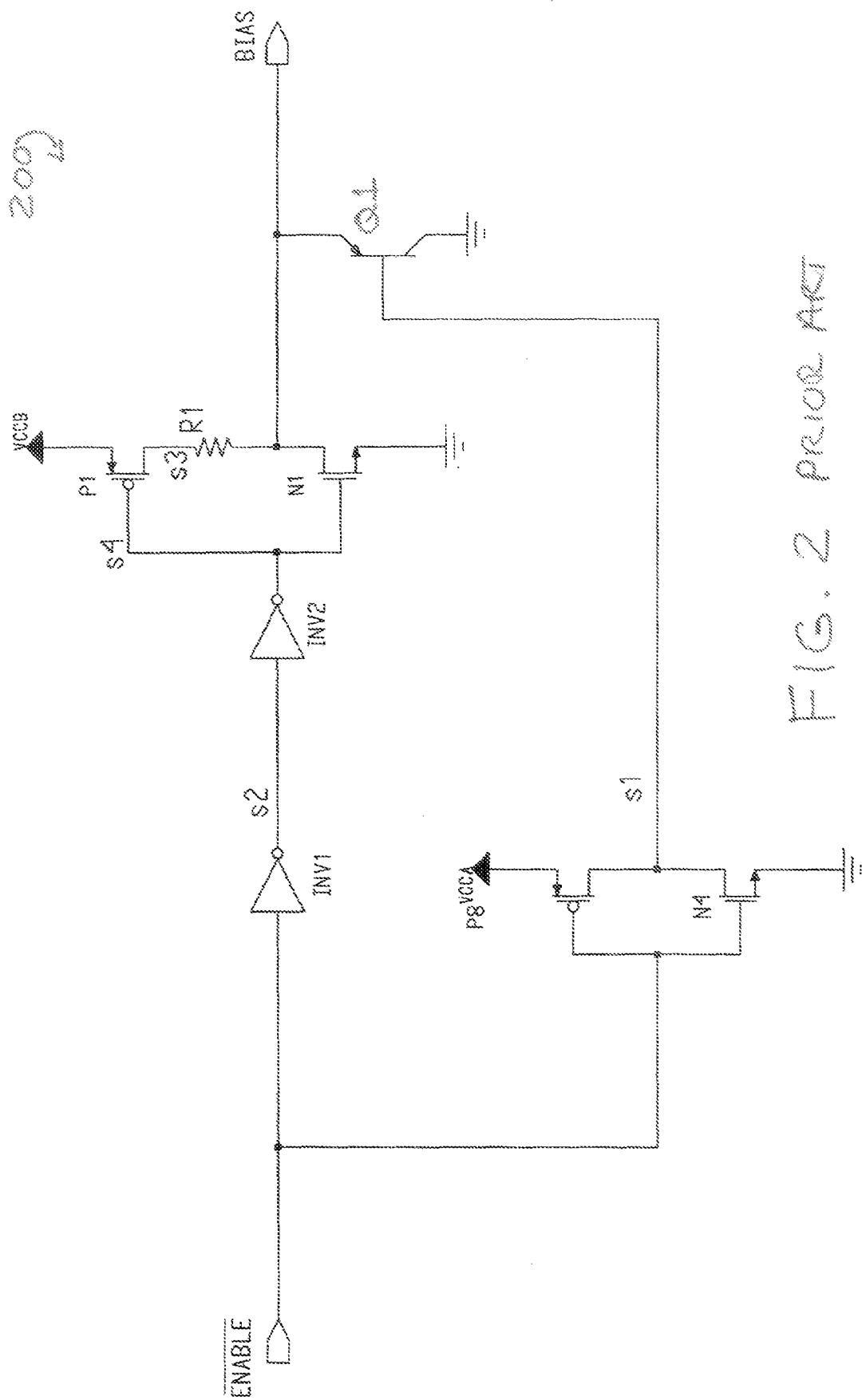
FIG. 2 illustrates a known biasing circuit.
Figure 3:
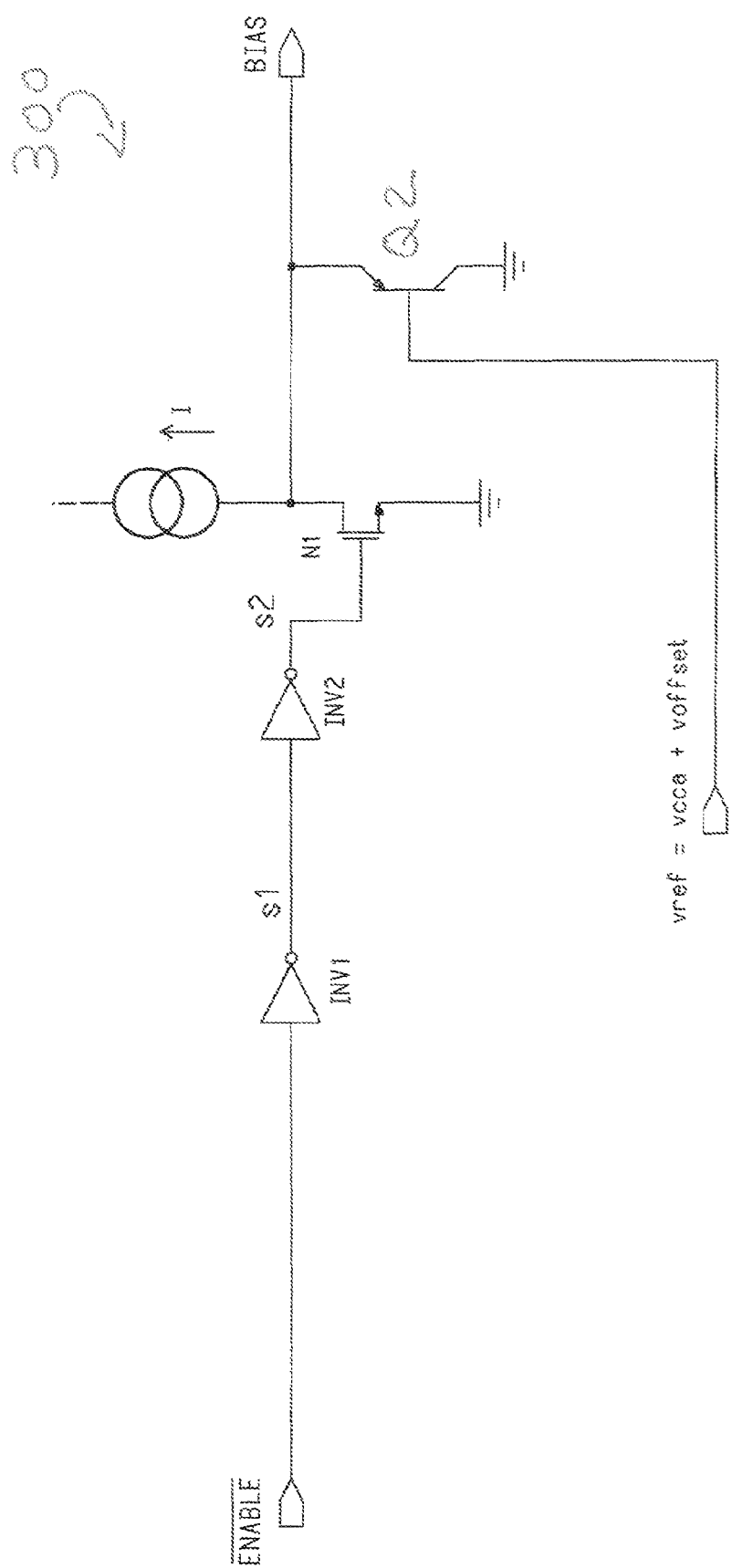
FIG. 3 illustrates a second known biasing circuit.
Figure 4:
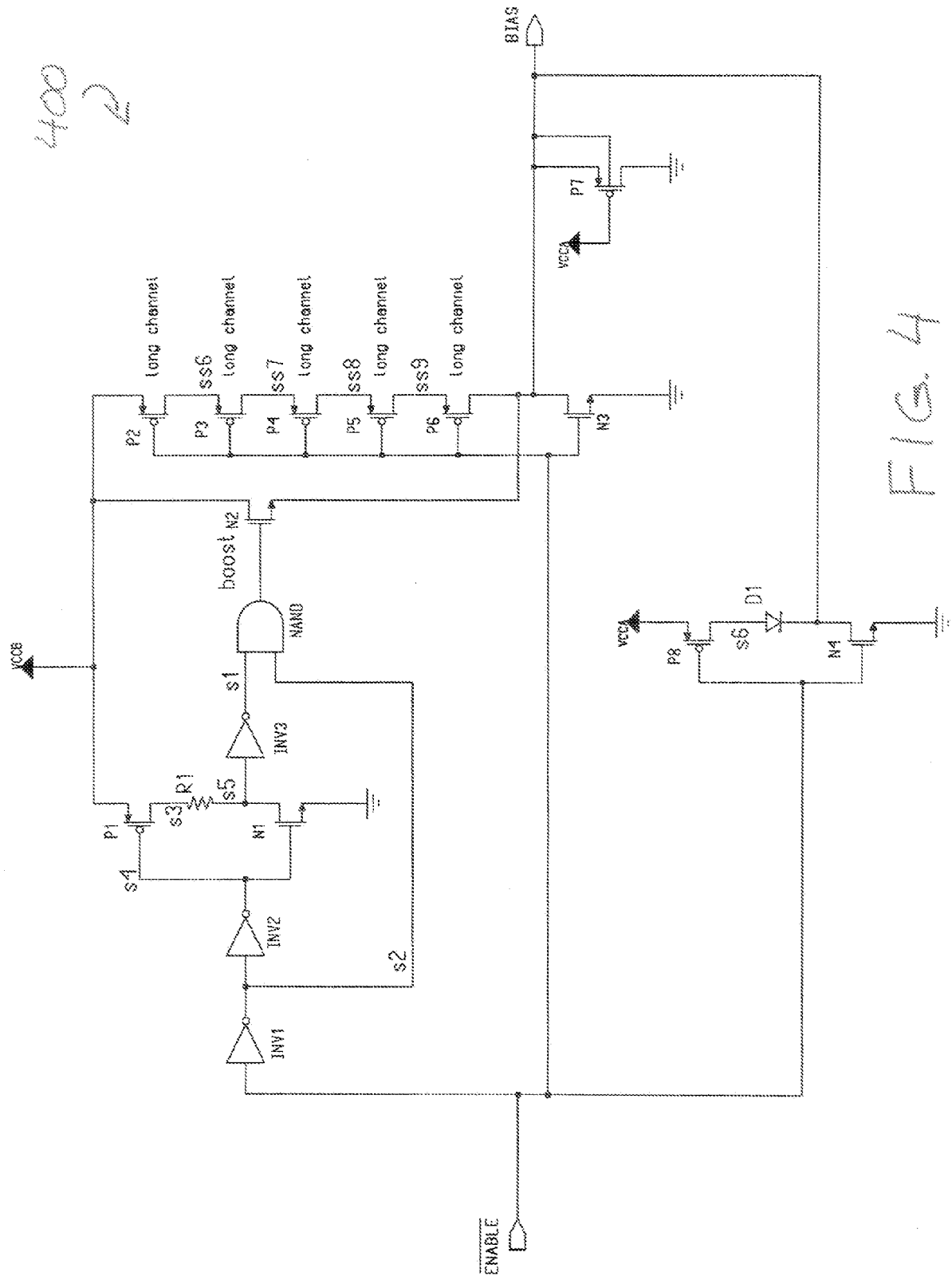
FIG. 4 illustrates a biasing circuit in accordance with the present invention.

FIG. 4 shows an embodiment of the present invention generally as 400. The biasing circuit 400 is coupled to the active low enable signal and provides a biasing signal BIAS to the gate of a N channel pass transistor, as shown in FIG. 1. The chip enable signal is coupled to the input of an inverter INV1 the output of which is coupled to the input of the inverter INV2 and to one input of a two input NAND gate NAND. The output of the inverter INV2 is coupled to the gates of a PMOS transistor P1 and an NMOS transistor N1 coupled between the power supply VCCB and ground. The source of transistor P1 is connected to VCCB and the source of transistor N1 is connected to ground. The drains of both transistors are coupled together via resistor R1. The junction of the drain of transistor N1 and resistor R1 is coupled via inverter INV3 to the second input of the NAND gate. The output of the NAND gate is coupled to the gate of a boost NMOS transistor N2, the drain of which is connected to VCCB and the source of which is connected to the output BIAS. Connected between VCCB and the output BIAS are five long channel PMOS transistors P2, P3, P4, P5 and P6, connected in series. The gates of these transistors are tied together and connected to the chip enable signal. Also connected to the chip enable signal is the gate of an NMOS transistor N3 which has its drain connected to the output BIAS and its source connected to ground. A PMOS transistor P7 has its source and back gate connected to the output BIAS and its drain connected to ground. The gate of this transistor is connected to the lower voltage supply level VCCA. Connected between the chip enable signal and the output BIAS is a switching circuit having a PMOS transistor P8 connected between VCCA and a NMOS transistor N4. The source of transistor of P8 is connected VCCA and the source of transistor N4 is connected to ground. The drains of the two transistors are connected together via a Schottky diode D1. The enable signal is coupled to the gates of the two transistors, which are connected together and the output of the circuit between the cathode of the diode D1 and the drain of transistor N4 is connected to the output BIAS.

In operation, the five long channel PMOS transistors are biased ON to provide the steady state biasing signal for the NMOS pass transistor such as the transistor 110 shown in FIG. 1, for example. When the chip enable signal is active, transistor P8 is biased on provide a voltage which is one Schottky diode drop less than the lower voltage VCCA to the bias level output. This brings the voltage on the gate of the pass transistor up to a voltage close to VCCA very quickly. This can raise the BIAS voltage to approximately 90% of its final value for example. The circuit also provides a one-shot comprising the inverters INV1, INV2 and INV3 the transistors P1 and N1, resistor R1 and the NAND gate to drive transistor N2 which bypasses the PMOS transitors P2, P3, P4, P5 and P6 to connect the higher supply voltage VCCB to node BIAS through NCH N2. This further pulls node BIAS up from one Schottky diode drop below VCCA up to an intermediate voltage above VCCA, but below VCCB—the pullup action of NMOS N2 being limited by the body effect. However, as stated earlier, it is desirable to have the voltage only one volt or one $V_T$ above the voltage level VCCA in order to avoid large current flows from the supply VCCB to VCCA, which is highly undesirable. Therefore, this higher voltage is only applied for a short period of time controlled by the duration of the one-shot signal and the voltage is clamped by transistor P7 to provide a voltage which is approximately one $V_T$ above the voltage VCCA at the output. By providing the voltage VCCB for a short period of time only, a substantial current flow is only through the limiting transistor P7 for this short period of time. Then only the smaller current provided by the transistors P2-P6 is required to be handled by the clamp transistor P7.

The circuit shown in FIG. 4 has a maximum static current on the order of five uA and an enable time on the order of twenty nanoseconds, compared with the two hundred uA static current required by the known circuits and a two microsecond enable time for those circuits. Furthermore, the multi stage process generating the bias voltage minimizes overshoot or undershoot at the bias output while also providing enough drive to charge quickly up the gate capacitance of pass transistor and any bypass capacitances that are placed at the gate of the bypass transistor to reduce noise at the gate.

Figure 5:
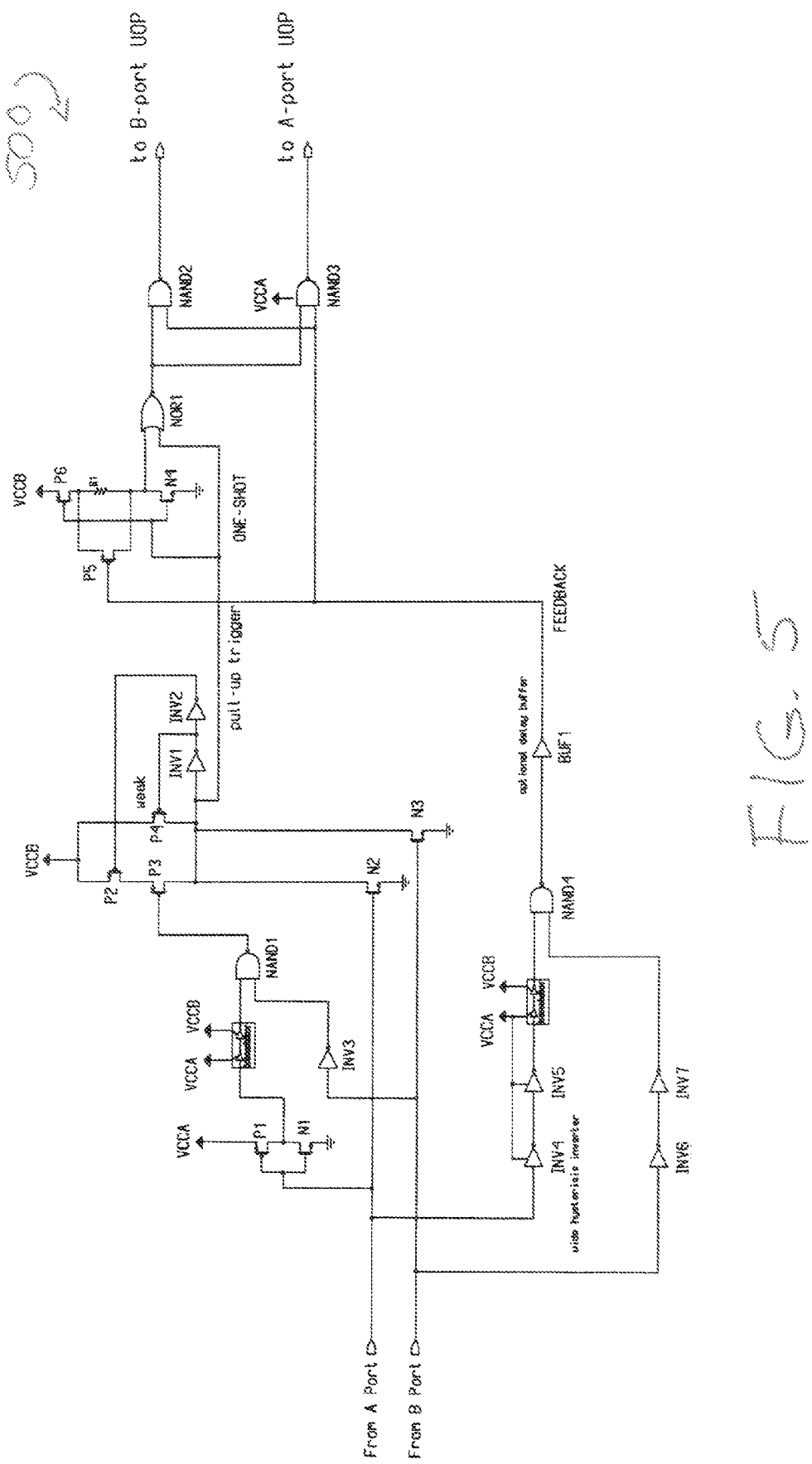
FIG. 5 illustrates a trigger and one-shot circuit suitable for use with the pass gate signal translation circuit having the biasing circuit illustrated in FIG. 4.

A one-shot circuit suitable for use with a pass transistor signal level translator as shown in FIG. 1 can be the detection circuit and one-shot circuit with feedback described in the U.S. patent application Ser. No. 11/382,995 entitled "ACCELERATOR OUTPUT STAGE THAT ADJUSTS DRIVE DURATION TO LOADING" filed May 12, 2006 and U.S. patent application Ser. No. 60/683,934 filed on May 23, 2005 and incorporated herein by reference in their entirety; And by U.S. patent application Ser. No. 11/239,194 entitled "CIRCUIT FOR DETECTING TRANSITIONS ON EITHER OF TWO SIGNAL LINES REFERENCED AT DIFFERENT POWER SUPPLY LEVELS" filed on Sep. 29, 2005 and incorporated herein by reference in its entirety. A modification of these circuits suitable for utilization in a pass gate voltage translator is shown in FIG. 5 generally as 500. As can be seen in FIG. 5, signals from both port A and port B are coupled to the pull-up trigger circuit the output of which fires a one-shot circuit to provide drive to the upper output transistor UOP for both the A port and the B port. Signals from the A port and the B port are applied through inverters INV4, INV5, INV6 and INV7 to the input of a NAND gate 4 the output of which is applied to one input of the NAND gate for the A port and for the B port output transistors and to a transistor P5 which shorts out the transistor R1 in the one-shot circuit to reset it. The signal from the A port passes through a signal translator VCCA to VCCB both in the feedback circuit and in the pull-up trigger circuit so that the circuits can operate off of the VCCB supply.

While the invention has been particularly shown and described with reference in preferred embodiments thereof it is well understood by those skilled in the art that various changes and modifications can be made in the invention without departing from the spirit and scope of the invention as defined by the appended claims.

What is claimed is:

1. In a pass transistor signal level translator comprising a pass transistor having a bias circuit and being coupled between a first voltage level and a higher second voltage level, the bias circuit for the pass transistor comprising:
   a first switching circuit coupled to the first voltage level for providing a bias voltage to a gate of the pass transistor that is a first voltage drop less than the first voltage level, wherein the first voltage drop is generated by a Schottky diode;
   a second switching circuit coupled to the second voltage level for providing a pulse at substantially the second voltage to the bias voltage; and
   a voltage clamping circuit coupled between the bias voltage and a reference voltage for limiting the bias voltage to the gate of the pass transistor to substantially one $V_T$ higher than the first voltage level.

2. The bias circuit of claim 1 wherein the pulse at the second voltage is controlled by a one-shot circuit.

3. The bias circuit of claim 1 further comprising a steady state biasing voltage source having a series of long channel MOS transistors coupled between the second voltage level and the voltage clamping circuit.

4. The bias circuit of claim 1 further comprising a steady state biasing voltage source having a series of long channel MOS transistors coupled between the second voltage level and the voltage clamping circuit.

5. The bias circuit of claim 1 wherein the bias voltage is controlled by a chip enable signal.

6. The bias circuit of claim 2 wherein the one-shot circuit is triggered by a chip enable signal.

7. A pass transistor signal level translator comprising:
   a first terminal related to a first voltage level;
   a second terminal related to a second voltage level, the second voltage level exceeding the first voltage level;
   a pass transistor coupled between the first and second terminals; a bias circuit for controlling voltage on a gate of the pass transistor comprising:
   a first circuit providing a voltage a first voltage drop less than the first voltage level coupled to a gate of the pass transistor, wherein the first voltage drop is generated by a Schottky diode;
   a pulse generator for generating a pulse at the second voltage level coupled to the gate of the pass transistor; and
   a voltage clamping circuit coupled between the gate of the pass transistor and a reference voltage for limiting the voltage on the gate of the pass transistor to substantially on $V_T$ higher than the first voltage level.

8. A pass transistor signal level translator comprising:
   a first terminal related to a first voltage level:
   a second terminal related to a second voltage level, the second voltage level exceeding the first voltage level:
   a pass transistor coupled between the first and second terminal;
   a bias circuit for controlling voltage on a gate of the pass transistor comprising:
   a first circuit providing a voltage one Schottky diode drop less than the first voltage level coupled to a gate of the pass transistor;
   a pulse generator for generating a pulse at the second voltage level coupled to the gate of the pass transistor; and
   a voltage clamping circuit coupled between the gate of the pass transistor and a reference voltage and further comprising:
   a first one-shot circuit coupled to both the first and the second terminals for generating a pulse when the voltage at either terminal transitions from a low logic level to a high logic level; and
   a first pull-up transistor coupled between the first terminal and a first voltage level supply and responsive to the pulse generated by the first one-shot circuit for coupling the first voltage supply to the first terminal.

9. The signal level translator of claim 8 further comprising:
   a second pull-up transistor coupled between the second terminal and a second voltage supply and responsive to the pulse generated by the first one-shot circuit for coupling the second voltage supply to the second terminal.

10. The signal level translator of claim 9 further comprising:
    a first pull-up resistor in parallel to the first pull-up transistor; and
    a second pull-up resistor in parallel to the second pull-up transistor.

11. The signal translator of claim 7 wherein the first circuit is responsive to a chip enable signal to switch the voltage one Schottky diode drop less than the first voltage to the gate of the pass transistor.

12. The signal translator of claim 7 wherein the pulse generator is responsive to a one-shot circuit.

13. The signal translator of claim 12 wherein the one-shot circuit is triggered by the chip enable signal.

14. The bias circuit of claim 7 further comprising a steady state biasing voltage source having a series of long channel MOS transistors coupled between the second voltage level and the voltage clamping circuit.

15. The bias circuit of claim 8 further comprising a steady state biasing voltage source having a series of long channel MOS transistors coupled between the second voltage level and the voltage clamping circuit.

16. A method of biasing a pass transistor in a pass transistor signal level translator circuit, the pass transistor signal level translator circuit comprising the pass transistor having a bias circuit and being coupled between a first terminal related to a first voltage and a second terminal related to a second voltage greater than the first voltage comprising:
   providing a first switched voltage related to the first voltage;
   providing a second switched voltage related to the second voltage;

providing a steady state voltage a first voltage drop below the first related to the second voltage, wherein the first voltage drop is generated by a Schottky diode and clamping the bias voltage at one $V_T$ above the first voltage.

17. The method of claim 16 wherein the first switched voltage is switched by a chip enable signal;

the second switched voltage is controlled by a one-shot circuit; and the steady state voltage is provided by a string of long channel transistors.

18. In a pass transistor signal level translator comprising a pass transistor having a bias circuit and being coupled between a first voltage level and a higher second voltage level, a bias circuit for the pass transistor comprising:

a first switching circuit coupled to the first voltage level for providing a bias voltage that is a first voltage drop less than the first voltage level, wherein the first voltage drop is generated by a Schottky diode;

a second switching circuit coupled to the second voltage level for providing a pulse at substantially the second voltage to the bias voltage;

a voltage clamping circuit coupled between the bias voltage and a reference voltage for limiting the bias voltage for the pass transistor to substantially one $V_T$ higher than the first voltage level; and further comprising a steady state biasing voltage source having a series of long channel MOS transistors coupled between the second voltage level and the voltage clamping circuit.

* * * * *

UNITED STATES PATENT AND TRADEMARK OFFICE
CERTIFICATE OF CORRECTION

PATENT NO.        : 7,667,519 B2                                               Page 1 of 1
APPLICATION NO. : 11/419831
DATED             : February 23, 2010
INVENTOR(S)       : Mark Welty It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 390 days.

Signed and Sealed this

Twenty-eighth Day of December, 2010

David J. Kappos
*Director of the United States Patent and Trademark Office*